(12) United States Patent
Nguyen

(10) Patent No.: US 8,730,734 B2
(45) Date of Patent: *May 20, 2014

(54) ACCESS LINE DEPENDENT BIASING SCHEMES

(71) Applicant: Micron Technology, Inc., Boise, ID (US)

(72) Inventor: Dzung H. Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/746,114

(22) Filed: Jan. 21, 2013

(65) Prior Publication Data

US 2013/0135935 A1 May 30, 2013

Related U.S. Application Data

(63) Continuation of application No. 12/686,721, filed on Jan. 13, 2010, now Pat. No. 8,358,540.

(51) Int. Cl.
*G11C 11/34* (2006.01)

(52) U.S. Cl.
USPC .................... 365/185.18; 365/185.13

(58) Field of Classification Search
CPC .............. G11C 8/08; G11C 8/14; G11C 8/18; G11C 16/08
USPC .............. 365/185.13, 185.18, 185.02, 185.23
See application file for complete search history.

(56) References Cited

U.S. PATENT DOCUMENTS

| | | | |
|---|---|---|---|
| 5,754,567 A | 5/1998 | Norman | |
| 5,991,221 A | 11/1999 | Ishikawa et al. | |
| 6,101,125 A | 8/2000 | Gorman | |
| 6,121,789 A | 9/2000 | Liu et al. | |
| 6,137,181 A | 10/2000 | Nguyen et al. | |
| 6,163,191 A | 12/2000 | Miyagi | |
| 6,366,114 B1 | 4/2002 | Liu et al. | |
| 6,381,670 B1 | 4/2002 | Lee et al. | |
| 6,930,536 B2 | 8/2005 | Nazarian et al. | |
| 6,982,905 B2 | 1/2006 | Nguyen | |
| 7,061,306 B2 | 6/2006 | Nazarian et al. | |
| 7,203,093 B2 | 4/2007 | Nguyen | |
| 7,295,478 B2 | 11/2007 | Wan et al. | |
| 7,296,066 B2 | 11/2007 | Lehaff et al. | |

(Continued)

OTHER PUBLICATIONS

International Search Report and Written Opinion for related PCT Application No. PCT/US2011/000046 dated Sep. 7, 2011 (10 pages).

(Continued)

*Primary Examiner* — Douglas King
(74) *Attorney, Agent, or Firm* — Brooks, Cameron & Huebsch, PLLC

(57) ABSTRACT

The present disclosure includes methods, devices, and systems for access line biasing. One embodiment includes selecting, using a controller external to the memory device, a particular access line dependent biasing scheme and corresponding bias conditions for use in performing an access operation on an array of memory cells of the memory device, and performing the access operation using the selected particular access line dependent biasing scheme and corresponding bias conditions. In one or more embodiments, the selected particular access line dependent biasing scheme and corresponding bias conditions is selected by the controller external to the memory device based, at least partially, on a target access line of the array.

20 Claims, 6 Drawing Sheets

(56) References Cited

U.S. PATENT DOCUMENTS

| | | |
|---|---|---|
| 7,345,924 B2 | 3/2008 | Nguyen et al. |
| 7,463,520 B2 | 12/2008 | Aritome |
| 7,505,323 B2 | 3/2009 | Nguyen et al. |
| 7,525,842 B2 | 4/2009 | Nguyen et al. |
| 8,358,540 B2 * | 1/2013 | Nguyen .................. 365/185.18 |
| 2002/0054507 A1 | 5/2002 | Makuta et al. |
| 2004/0123181 A1 | 6/2004 | Moon et al. |
| 2004/0264227 A1 | 12/2004 | Kojima et al. |
| 2005/0078518 A1 | 4/2005 | Nguyen |
| 2005/0093613 A1 | 5/2005 | Nazarian et al. |
| 2005/0219902 A1 | 10/2005 | Nazarian et al. |
| 2006/0034119 A1 | 2/2006 | Nguyen |
| 2006/0177379 A1 | 8/2006 | Asgari |
| 2006/0256620 A1 | 11/2006 | Nguyen et al. |
| 2006/0274594 A1 | 12/2006 | Huckaby et al. |
| 2006/0279990 A1 | 12/2006 | Wan et al. |
| 2007/0047326 A1 | 3/2007 | Nguyen et al. |
| 2007/0225928 A1 | 9/2007 | Gatzemeier et al. |
| 2007/0230252 A1 | 10/2007 | Campardo et al. |
| 2007/0279988 A1 | 12/2007 | Nguyen |
| 2007/0291542 A1 | 12/2007 | Aritome |
| 2008/0046630 A1 | 2/2008 | Lasser |
| 2008/0130373 A1 | 6/2008 | Nguyen et al. |
| 2008/0159007 A1 | 7/2008 | Sekar et al. |
| 2008/0159019 A1 | 7/2008 | Sutardja |
| 2008/0181003 A1 | 7/2008 | Nguyen et al. |
| 2008/0253217 A1 | 10/2008 | Taeuber et al. |
| 2009/0016143 A1 | 1/2009 | Incarnati et al. |
| 2009/0154247 A1 | 6/2009 | Nguyen et al. |
| 2009/0201736 A1 | 8/2009 | Nguyen et al. |
| 2009/0244982 A1 | 10/2009 | Han et al. |
| 2009/0316483 A1 | 12/2009 | Kim et al. |

OTHER PUBLICATIONS

EP Search Report for related EP Patent No. 11733173.6, mailed Dec. 4, 2013, 5 pages.

* cited by examiner

*314*

| BIASING SCHEME | BIAS CONDITIONS | | | |
|---|---|---|---|---|
| *316-1* — PROGRAM INHIBIT | 1 | 2 | • • • | N |
| *316-2* — PROGRAM VOLTAGE RAMP RATE | 1 | 2 | • • • | N |
| *316-3* — READ | 1 | 2 | • • • | N |

*Fig. 3*

ACCESS LINE DEPENDENT BIASING SCHEMES

PRIORITY INFORMATION

This application is a Continuation of U.S. patent application Ser. No. 12/686,721, filed Jan. 13, 2010, to be issued as U.S. Pat. No. 8,358,540 on Jan. 22, 2013, the specification of which is incorporated by reference herein.

TECHNICAL FIELD

The present disclosure relates generally to semiconductor memory devices, methods, and systems, and more particularly, to access line dependent biasing schemes.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Various types of memory can be used in memory systems. For example, Flash memory can be part of a memory system as internal memory or as removable memory that can be coupled to the memory system through an interface via a format such as USB (universal serial bus), MMC (multi media card), CF (compact flash), or SD (secure digital), among others. Flash memory devices, including floating gate flash devices and charge trap flash (CTF) devices, may be utilized as non-volatile memory for a wide range of electronic applications. Flash memory devices typically use a one-transistor memory cell that allows for high memory densities, high reliability, and low power consumption.

Uses for flash memory include memory for sold state drives (SSDs), personal computers, personal digital assistants (PDAs), digital cameras, cellular telephones, portable music players, e.g., MP3 players, and movie players, among others. Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line (e.g., a word line as commonly referred to in the art). However each memory cell is not directly coupled to a data line (e.g., a bit line as commonly referred to in the art) by its drain. Instead, the memory cells of the array are coupled together in series, source to drain, between a common source and a bit line, where the memory cells commonly coupled to a particular bit line are referred to as a "column".

NAND memory devices can include a number of arrays of memory cells organized into physical blocks of memory cells. When accessing memory cells within a block of memory cells, different sets of word lines within the block can be biased with different voltages depending upon the desired operation and the relation of the set of word lines to a target (e.g., a selected) word line. During access operations (e.g., program operations, verify operations, or read operations), other portions of a memory cell (e.g., a well, a source region, or bit line) can also be biased with different voltages depending upon the desired operation and the relation of the set of word lines to the target word line.

For instance, several different program inhibit schemes (e.g., techniques) can be used in association with a program operation, depending upon the position of a target word line. Examples of different program inhibit techniques include self-boosting, erased area self-boosting (EASB), revised erased area self-boosting (REASB), local self-boosting (LSB), and revised local self-boosting (RLSB).

Using different biasing schemes depending on the position of a target word line can provide various benefits. For instance, using different program inhibit schemes can reduce program disturb and/or read disturb, among other benefits.

BRIEF DESCRIPTION OF THE DRAWINGS

FIG. 3 is a table illustrating a number of selectable biasing schemes and corresponding bias conditions in accordance with one or more embodiments of the present disclosure.

DETAILED DESCRIPTION

Figure 1:
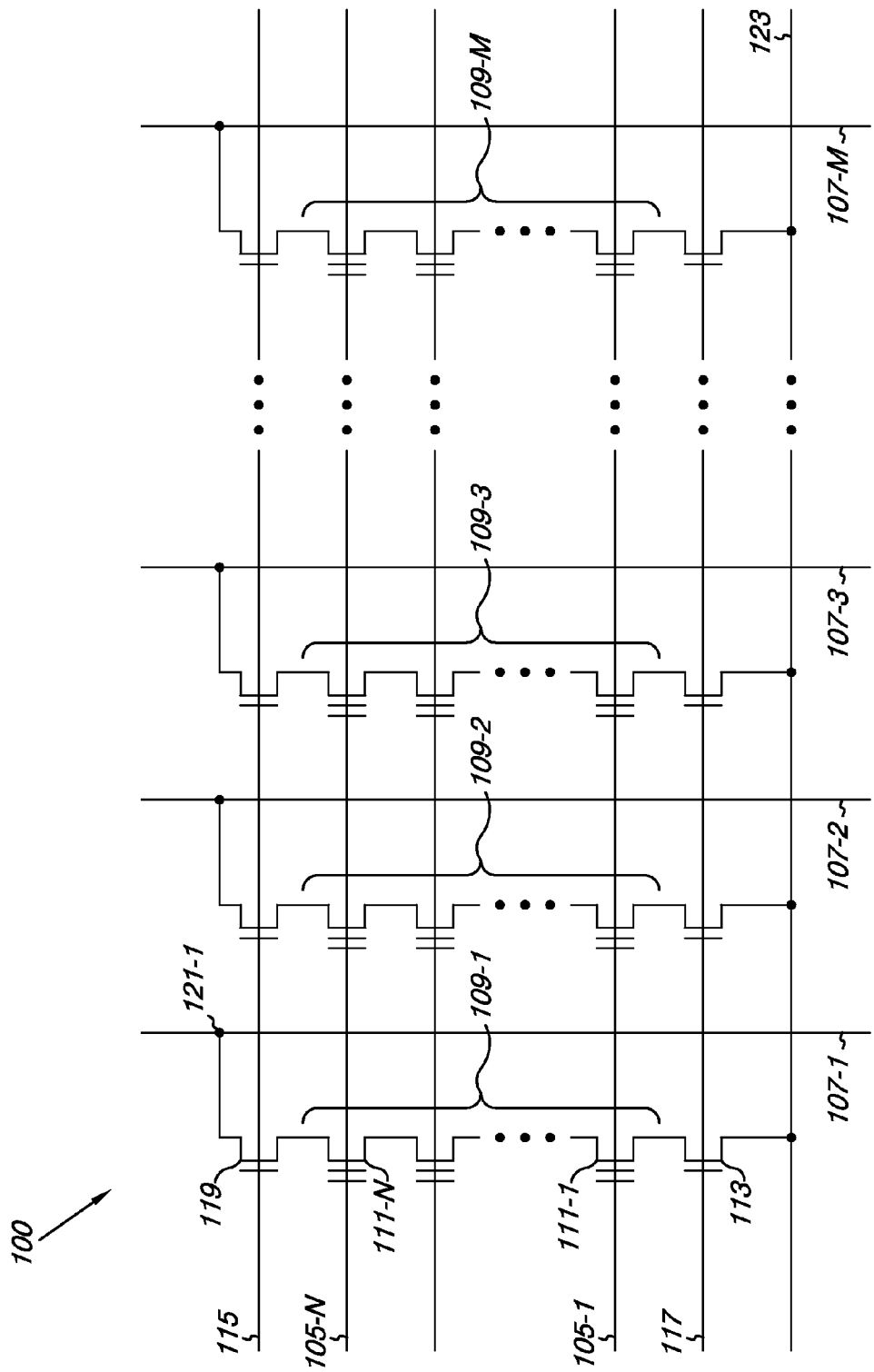
FIG. 1 is a schematic of a portion of a non-volatile memory array that can be operated in accordance with one or more embodiments of the present disclosure.

The present disclosure includes methods, devices, and systems for access line biasing. One embodiment includes selecting, using a controller external to the memory device, a particular access line dependent biasing scheme and corresponding bias conditions for use in performing an access operation on an array of memory cells of the memory device, and performing the access operation using the selected particular access line dependent biasing scheme and corresponding bias conditions. In one or more embodiments, the selected particular access line dependent biasing scheme and corresponding bias conditions is selected by the controller external to the memory device based, at least partially, on a target access line of the array.

One or more embodiments described herein facilitate flexibility in controlling global access lines to apply differing biasing schemes to memory cells of a non-volatile memory device, and can reduce the design cycle time and die size of non-volatile memory devices, which can improve the functionality of the memory devices, among other benefits as described further herein.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "K," and "J," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 105 may reference element "05" in FIG. 1, and a similar element may be referenced as 205 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of a non-volatile memory array 100 that can be operated in accordance with one or more embodiments of the present disclosure. The embodiment of FIG. 1 illustrates a NAND architecture non-volatile memory. However, embodiments described herein are not limited to this example. As shown in FIG. 1, the memory array 100 includes access lines (e.g., word lines 105-1, . . . , 105-N) and corresponding data lines (e.g., local bit lines 107-1, 107-2, 107-3, . . . , 107-M). For ease of addressing in the digital environment, the number of word lines 105-1, . . . , 105-N and the number of local bit lines 107-1, 107-2, 107-3, . . . , 107-M can be some power of two (e.g., 256 word lines by 4,096 bit lines).

Memory array 100 includes NAND strings 109-1, 109-2, 109-3, . . . 109-M. Each NAND string includes non-volatile memory cells 111-1, . . . , 111-N, each associated with a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS) (e.g., a field-effect transistor (FET) 113), and a drain select gate (SGD) (e.g., FET 119). Each source select gate 113 is configured to selectively couple a respective NAND string 109 to a common source 123 responsive to a signal on source select line 117, while each drain select gate 119 is configured to selectively couple a respective NAND string to a respective bit line 107 responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N (e.g., a floating-gate transistor, of the corresponding NAND string 109-1).

In one or more embodiments, construction of non-volatile memory cells, 111-1, . . . , 111-N, includes a source, a drain, a floating gate or other charge storage node, and a control gate. Non-volatile memory cells, 111-1, . . . , 111-N, have their control gates coupled to a word line, 105-1, . . . , 105-N respectively. A "column" of the non-volatile memory cells, 111-1, . . . , 111-N, make up the NAND strings (e.g., 109-1, 109-2, 109-3, . . . , 109-M), and are coupled to a given local bit line (e.g., 107-1, 107-2, 107-3, . . . , 107-M), respectively. A "row" of the non-volatile memory cells are those memory cells commonly coupled to a given word line (e.g., 105-1, . . . , 105-N). The use of the terms "column" and "row" is not meant to imply a particular linear (e.g., vertical and/or horizontal, orientation of the non-volatile memory cells). A NOR array architecture would be similarly laid out, except that the string of memory cells would be coupled in parallel between the select gates.

As one of ordinary skill in the art will appreciate, subsets of cells coupled to a target (e.g., selected) word line (e.g., 105-1, . . . , 105-N), can be programmed and/or sensed (e.g., read) together as a group. During a program operation, a selected word line associated with the memory cells targeted for the program operation would receive a first voltage (e.g., a program voltage) designed to change the data state of memory cells associated with that word line if it is not program inhibited (e.g., via an inhibit voltage provided to the bit line to which the memory cell is coupled), while providing a second voltage (e.g., a pass voltage) to unselected/remaining word lines of the block designed to activate each memory cell associated with those word lines while not generating sufficient biasing to alter the program state of those memory cells, regardless of whether they are program inhibited. There are also other program operations in which various different biasing conditions (e.g., voltages) are used. For instance, there are operations where the selected word line receives a first voltage, an adjacent word line receives a second voltage and remaining unselected word lines receive a third voltage; where the selected word line receives a first voltage, a first adjacent word line receives a second voltage, a second adjacent word line receives a third voltage and remaining unselected word lines receive a fourth voltage; and where a selected word line receives a first voltage, an upper adjacent word line receives a second voltage, a lower adjacent word line receives a third voltage, a next lower adjacent word line receives a fourth voltage and remaining unselected word lines receive a fifth voltage.

Moreover, the particular biasing scheme and corresponding bias conditions associated with a particular program operation can be variable based, for example, on the relative position of the target word line (e.g., the selected word line to which the program voltage is provided) within a block of memory cells. That is, the biasing scheme can be word line dependent. Examples of biasing schemes that can be word line dependent include program inhibit schemes and program voltage ramp rate schemes, among others.

For instance, as noted above, several different program inhibit schemes can be used in association with a program operation, and the particular scheme selected (and corresponding bias conditions) can depend upon the position of a target word line (e.g., the biasing scheme can be word line dependent). Examples of different program inhibit schemes include self-boosting, erased area self-boosting (EASB), revised erased area self-boosting (REASB), local self-boosting (LSB), and revised local self-boosting (RLSB), with each of the different schemes including a distinct set of bias conditions associated therewith (e.g., a set of particular voltages to be provided to a selected word line, unselected word lines, a well region, a source region, and/or a bit line) in association with the program operation.

A sensing operation, such as a read or program verify operation, can include sensing a voltage and/or current change of a bit line coupled to a selected cell in order to determine the state of the selected cell. The sensing operation can involve providing a voltage to (e.g., driving) a bit line (e.g., bit line 107-1) associated with a selected memory cell above a voltage provided to a source (e.g., source line 123) associated with the selected memory cell. A sensing operation could alternatively include precharging the bit line 107-1 followed with discharge when a selected cell begins to conduct, and sensing the discharge.

Sensing the state of a selected cell can include providing (e.g., applying) a number of sensing voltages (e.g., read voltages "Vread") to a selected word line while providing a number of voltages to the word lines coupled to the unselected cells of the string sufficient to place the unselected cells in a conducting state independent of the threshold voltage of the unselected cells (e.g., read pass voltages "Vpass_read"). The bit line corresponding to the selected cell being read and/or verified can be sensed to determine whether or not the selected cell conducts in response to the particular sensing voltage provided to the selected word line. For example, the state of a selected cell can be determined by the word line voltage at which the bit line current reaches a particular reference current associated with a particular state.

A program verify operation can include providing a number of program verify voltages to a selected word line (e.g., after a programming pulse) to determine whether a memory cell coupled to the selected word line has reached a desired program state. In association with the program verify operation, a cache element can store a programming status of the selected memory cell (e.g., whether the selected memory cell has reached the desired program state). For example, the programming status of the selected memory cell can include one of programming complete and programming incomplete.

Prior to performing the program verify operation, the programming status of the selected memory cell can indicate that programming is incomplete. If the program verify operation determines that the selected memory cell has reached a desired program state, then the programming status (stored in the cache element) can be changed to indicate that programming is complete. Such a change in programming status can affect whether or not the selected memory cell will be program inhibited during subsequent programming pulse. For example, if the programming status stored in the cache element is programming incomplete, then the selected memory cell will not be program inhibited during a subsequent programming pulse provided to the selected word line. However, if the programming status stored in the cache element is programming complete, then the selected memory cell will be program inhibited during a subsequent programming pulse provided to the selected word line.

A read biasing scheme can also be word line dependent. That is, a read biasing scheme can include using a number of different read techniques, and the particular read biasing scheme and corresponding bias conditions can be selected based on the target word line (e.g., based on the position of the target word line within a block of memory cells). As an example, one particular read biasing scheme can be used if the target word line is located at an end (e.g., source end or drain end) of a string of cells, and a different read biasing scheme can be used if the target word line is not located at an end of the string.

In some instances, a different biasing scheme can be used for each respective word line. For instance, a different program inhibit biasing scheme (and associated set of particular bias conditions) can be used for each different word line. If a block of memory cells includes 64 word lines, then 64 different sets of bias conditions can be used (e.g., one set for each of the 64 different schemes). It would also be possible to have 64 different program ramp rate biasing schemes and 64 different read biasing schemes such that 192 different sets of bias conditions would be needed.

As discussed below in connection with FIG. 4, various prior art approaches to providing differing biasing schemes depending on a position of a selected word line include implementing the different schemes with large combinational logic located on the memory device (e.g., on a NAND die or chip). The combinational logic can include multiple built in trim registers and or complex driver circuitry (e.g., complex word line drivers, well drivers, source drivers, etc.) The different schemes can be activated through internal control circuitry (e.g., one or more control components located on the NAND die or chip) through multiple levels of address decoding to determine the position of a selected word line or group of word lines and to select the appropriate biasing scheme.

Such prior approaches have various drawbacks. For instance, implementing the different biasing schemes on the NAND device via combinational logic can increase the physical size (e.g., footprint) of the NAND device and/or reduce the area available for memory cells. Implementing several different biasing schemes via combinational logic can also increase the design cycle time. As such, prior approaches may implement few different schemes, which can reduce the flexibility on word line control and reduce the functionality of the memory device. Also, implementing the different biasing schemes via combinational logic according to the prior art presents difficulties in modifying the biasing schemes and/or adding additional biasing schemes to the memory device, which reduces flexibility and functionality of the memory device.

Figure 5:
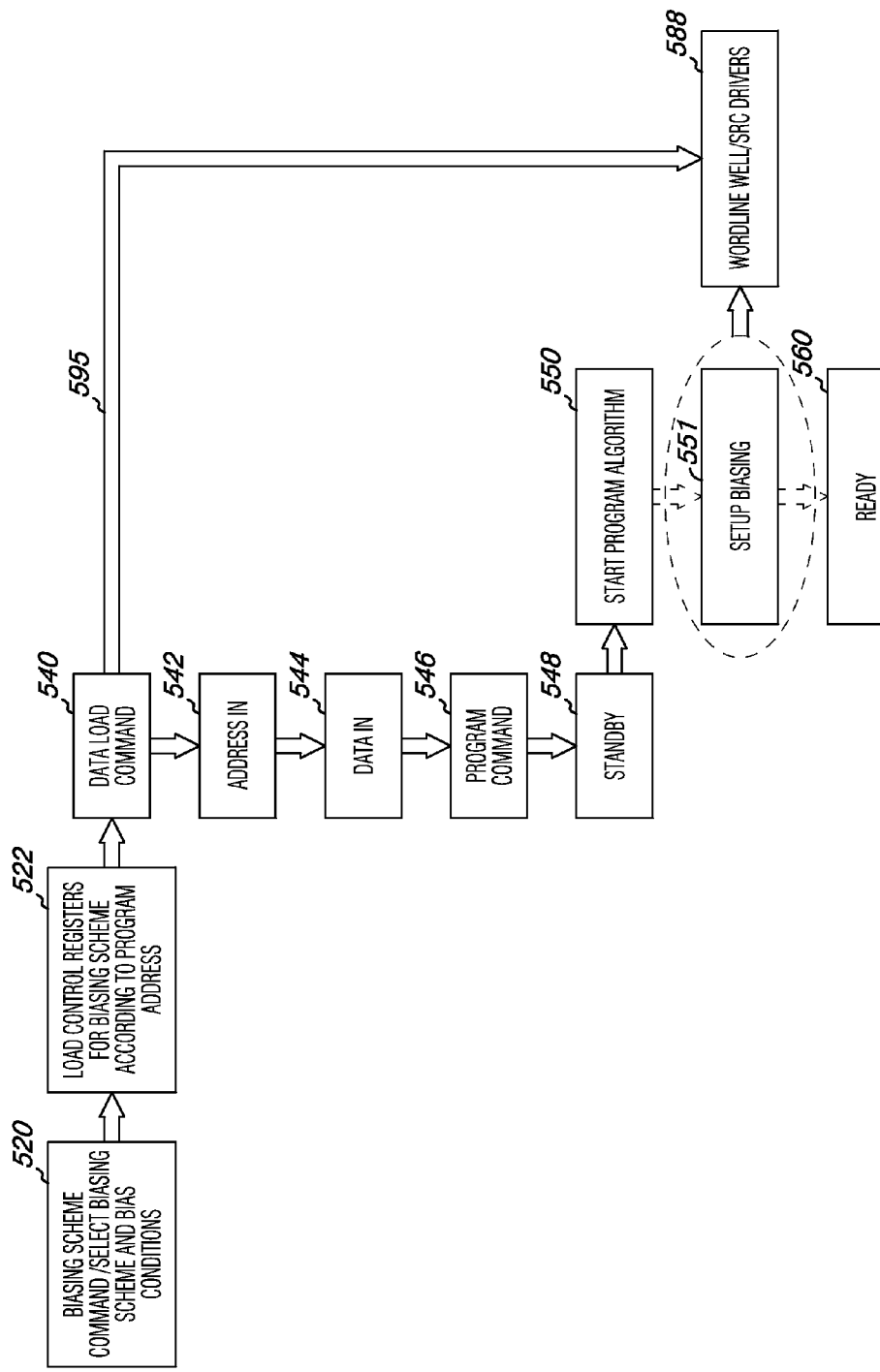
FIG. 5 is a flow diagram illustrating an access operation sequence including selection of an access line dependent biasing scheme in accordance with one or more embodiments of the present disclosure.
Figure 6:
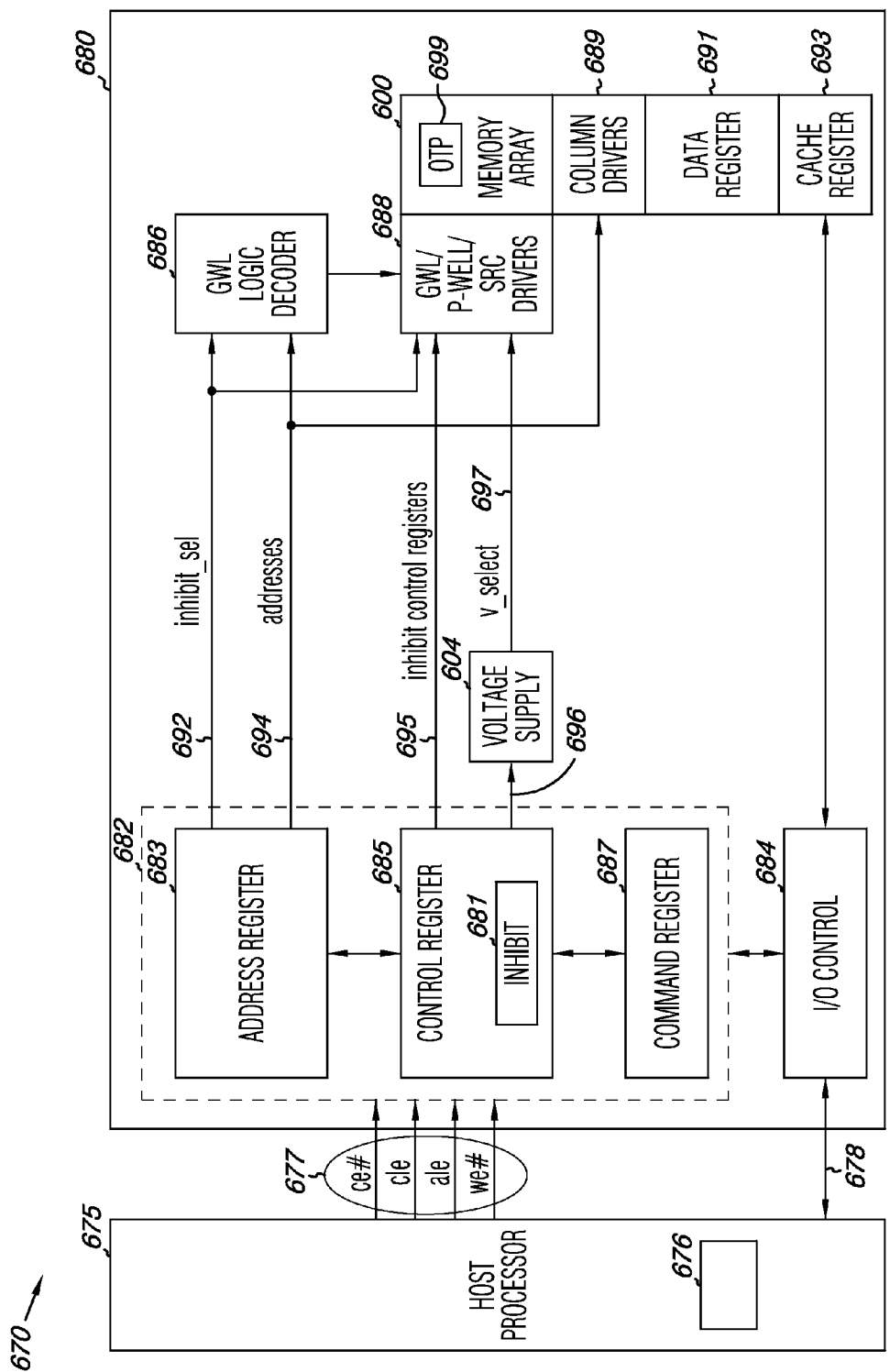
FIG. 6 illustrates a diagram of a memory system in accordance with one or more embodiments of the present disclosure.

In contrast, and as described further in connection with FIGS. 5-6, one or more embodiments of the present disclosure provide increased flexibility and functionality of non-volatile memory devices by shifting the selection function of word line dependent biasing schemes and corresponding bias conditions to a controller external to the memory device. In one or more embodiments, the external controller can be a host processor or can be embedded in a host processor. Various embodiments can reduce the amount of combinational logic used to implement multiple different word line dependent biasing schemes as compared to prior approaches, which can improve the design cycle time and yield of NAND devices. One or more embodiments of the present disclosure also provide the capability of adjusting biasing schemes and/or adding additional biasing schemes without physically modifying the hardware components (e.g., driver circuitry, decode circuitry, trim registers, etc.) of the NAND memory device.

Figure 2:
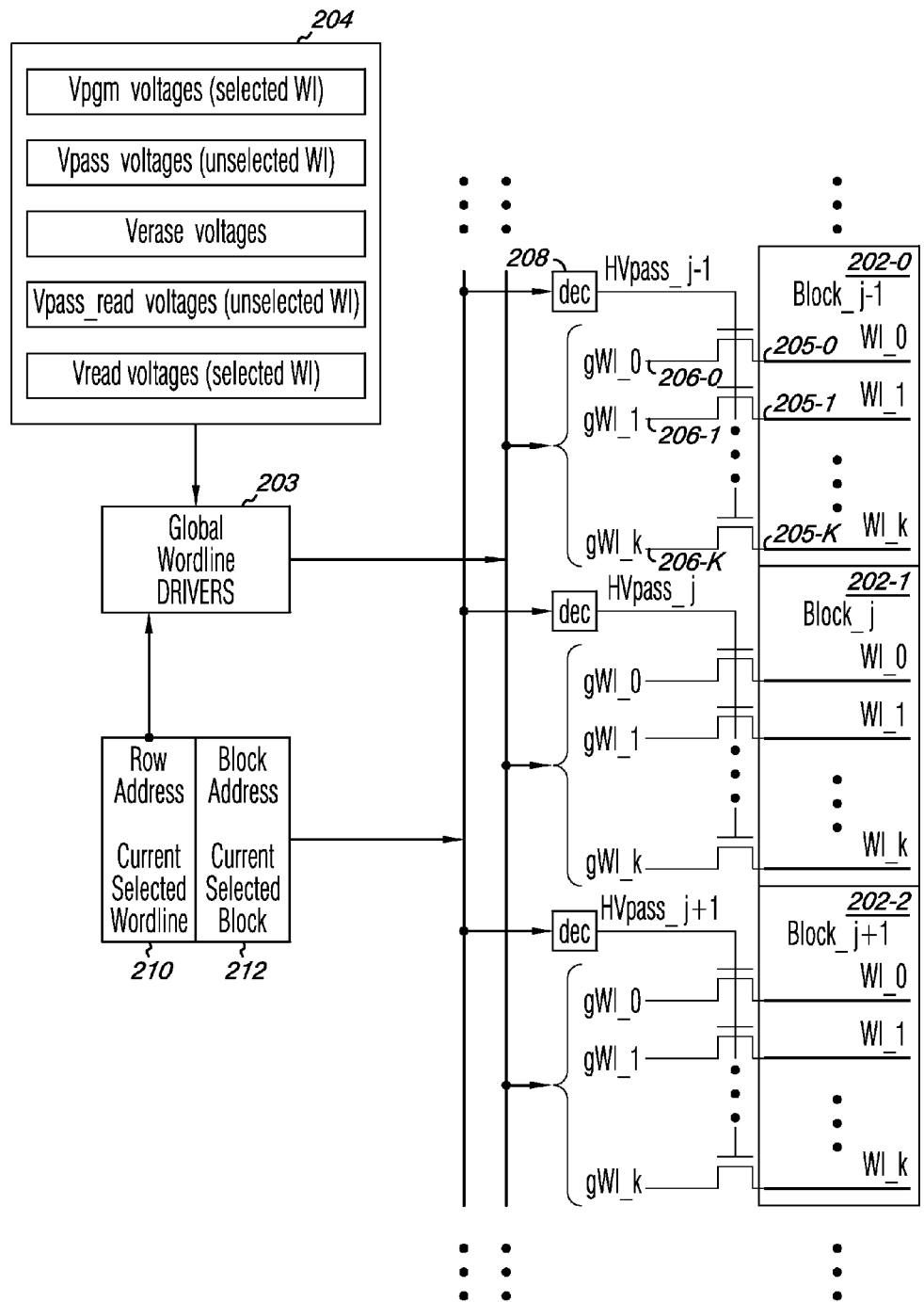
FIG. 2 is a functional block diagram of a portion of memory system in accordance with one or more embodiments of the present disclosure.

FIG. 2 is a functional block diagram of a portion of memory system in accordance with one or more embodiments of the present disclosure. The example shown in FIG. 2 includes a portion of a NAND flash memory device (e.g., device 680 shown in FIG. 6). The example illustrated in FIG. 2 includes a number of blocks of memory cells 202-0 (Block_j−1), 202-1 (Block_j), and 202-2 (Block_j+1). Each of the blocks 202-0, 202-1, and 202-2 include a number of local access lines (e.g., word lines 205-0 (Wl_0), 205-1 (Wl_1), . . . , 205-k (Wl_k)) having memory cells coupled thereto. Each of the local word lines 205-0, 205-1, . . . , 205-k of each block 202-0, 202-1, and 202-2 can be selectively coupled to one of a corresponding number of global word lines 206-0 (gWl_0), 206-1 (gWl_1), . . . , 206-k (gWl_k) via a driver transistor.

During operation, a decoder 208 associated with each of the blocks 202-0, 202-1, and 202-2 can be used to couple the global word lines 206-0, 206-1, . . . , 206-k to the local word lines 205-0, 205-1, ..., 205-k of a selected block based on a selected block address 212. For instance, if block 202-1 is the selected block, then the output of the decoder 208 associated with block 202-1 provides a voltage (HVpass_j) to the gates of the driver transistors associated with block 202-1 in order to couple the local word lines of the selected block to the global word lines 206-0, 206-1, ..., 206-k.

As illustrated in FIG. 2, global word line drivers 203 are coupled to each of the global word lines 206-0, 206-1, ..., 206-k. As such, the global word line driver 203 can be used to provide voltage signals to each of the local word lines 205-0, 205-1, ..., 205-k of a selected block. As an example, in a sensing operation such as a read or a program verify operation, the global word line drivers 203 can provide a read voltage (Vread) to a selected word line of a selected block (e.g., based on a received word line address 230, and a read pass voltage (Vread_pass) to the unselected word lines of the selected block via the appropriate corresponding global word lines.

As illustrated in FIG. 2, the memory system includes a voltage supply component 204 that can supply appropriate voltages to the global word line drivers 203, such as read voltages, read pass voltages, program voltages (Vpgm), program pass voltages (Vpass), and erase voltages (Verase). Embodiments are not so limited. For instance, in various embodiments of the present disclosure, the voltage supply component 204 can also supply various other voltages such as inhibit voltages and seeding voltages to the drivers 203 and/or other driver components of the system (not shown in FIG. 2).

FIG. 3 is a table 314 illustrating a number of selectable biasing schemes and corresponding bias conditions in accordance with one or more embodiments of the present disclosure. Table 314 illustrates a number of different types of biasing schemes 316-1 (Program Inhibit), 316-2 (Program Voltage Ramp Rate), and 316-3 (Read). Each of the biasing scheme types 316-1, 316-2, and 316-3 includes different corresponding sets of bias conditions (listed in table 314 as "1, 2, ..., N"). The indicator "N" can represent the number of local word lines associated with a particular block of a memory array (e.g., 32, 64, 128, etc.). That is, one or more embodiments can include multiple different selectable program inhibit schemes, multiple different selectable program voltage ramp rate schemes, and/or multiple different selectable read biasing schemes.

As described further below, in various embodiments, a particular word line dependent biasing scheme (e.g., 316-1, 316-2, 316-3) and its corresponding bias conditions (1, 2, ..., N) can be selected by a controller external to the memory device for use in performing an access operation (e.g., a program, read, verify, or erase operation) on an array of memory cells of a memory device. The selected particular biasing scheme (e.g., the selected particular program inhibit scheme and corresponding bias conditions) can be selected by the external controller based, at least partially, on a position of a target word line of the array (e.g., based on a word line address of the target word line).

As illustrated in FIG. 3, a particular selected word line dependent biasing scheme is one of a number of different selectable biasing schemes. In various embodiments, the external controller can adjust at least one of the bias conditions corresponding to the at least one of the different selectable biasing schemes (e.g., from an initial value to an adjusted value). In one or more embodiments, the external controller can be configured to add one or more additional biasing schemes to the number of different selectable schemes. Adding and/or modifying biasing schemes can be accomplished via software and/or firmware on the external controller.

Figure 4:
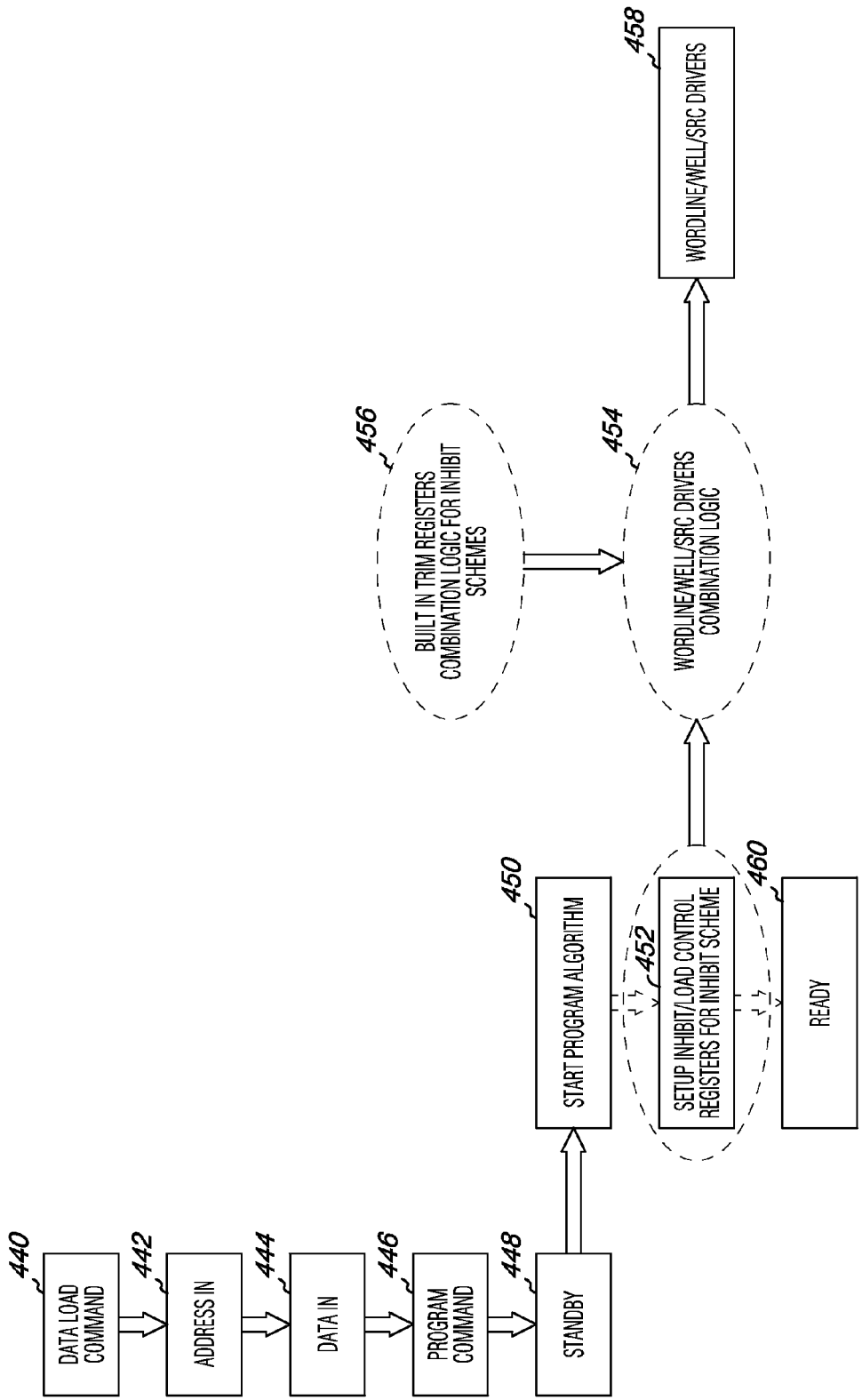
FIG. 4 is a flow diagram illustrating a program sequence in accordance with the prior art.

FIG. 4 is a flow diagram illustrating a program sequence in accordance with the prior art. At step 440, a data command (e.g., a data load command) is issued by an internal controller of a memory device (e.g., NAND device), which is coupled to, and configured to receive commands from, an external host (e.g., a processor of an external host). The internal controller and memory array of can be on the same IC memory device chip. The data load command can be input to an internal control component (e.g., a state machine and/or command circuitry) of the memory device, allowing data to be input to a data input/output (I/O) control component (e.g., an I/O buffer). The input data is recognized as a command and latched by the internal control component via a command latch signal.

In step 442, address data designating a page address is input to row decode and row control circuitry (e.g., word line driver circuitry) from the internal controller. The input address data is recognized as the page address and latched via the internal control component.

At step 444, program data is input to data the I/O buffer of the memory device. The input program data can be, for example, 532 bytes of program data, although various other sizes of program data are possible. The program data can be latched in a register (e.g., data register) for the selected bit lines. The program data can also be latched in a second register for the selected bit lines (e.g., to be used for verify operations).

At step 446, a program command is provided by the internal controller of the memory device and input to the data I/O buffer. The command is latched by the internal control component via the command latch signal. Step 448 indicates a standby time (e.g., a few micro seconds) before the program algorithm starts at step 450 (e.g., before program voltage pulses and other bias conditions are provided to the array in order to program memory cells using a particular biasing scheme, such as a particular program inhibit scheme to program the desired data to the array).

Prior to programming the desired data to the memory array, the particular biasing scheme and corresponding bias conditions are determined. In prior art approaches such as that shown in FIG. 4, the particular biasing scheme and corresponding bias conditions can be determined based on an address of the target word line via built in trim registers, and internal combination logic associated with address decode circuitry and/or various driver circuitry (e.g., word line, well, source, bit line drivers).

For instance, as illustrated at step 452, set up of a particular inhibit scheme begins and control registers associated with the particular inhibit scheme are loaded. The information (e.g., data) in from the control registers can be provided to combination logic associated with the various driver circuitry 454 along with data from the built in trim registers and associated combination logic 456 corresponding to the particular inhibit scheme. This information is then received by the various drivers 458. The drivers 458 drive the appropriate portions of the array with the particular bias conditions (e.g., voltages) corresponding to the selected program inhibit scheme when the memory device is ready, as shown at step 460.

Prior art accessing operations such as the prior art programming operation illustrated in FIG. 4 have various drawbacks. For instance, as discussed above, selecting and implementing the different program inhibit schemes with large combinational logic (e.g., complex word line drivers, well drivers, source drivers, decode circuitry, built in trim registers, among other combinational logic) located on the memory device (e.g., on a NAND die or chip) can increase the physical size (e.g., footprint) of the NAND device, increase the design cycle time, and can limit the number of available biasing schemes, which can reduce the flexibility on word line control and reduce the functionality of the memory device.

FIG. 5 is a flow diagram illustrating an access operation sequence including selection of an access line dependent biasing scheme in accordance with one or more embodiments of the present disclosure. FIG. 6 illustrates a simplified block diagram of a memory system 670 in accordance with one or more embodiments of the present disclosure. For instance, memory system 670 illustrated in FIG. 6 can perform the steps described in the embodiment illustrated in FIG. 5. As such, the system 670 of FIG. 6 is discussed in conjunction with the flow diagram of FIG. 5.

In various embodiments, memory system 670 includes a memory device 680 in communication with (e.g., coupled to) an external controller. In the embodiment illustrated in FIG. 6, the memory system 670 includes a memory device 680 (e.g., a NAND memory device) coupled to a host processor 675. Some examples of memory system 670 include personal computers, personal digital assistants (PDAs), digital cameras, digital media players, digital recorders, games, appliances, vehicles, wireless devices, mobile telephones, memory modules, and the like. The host processor 675 may be an external memory controller or other external processor. In various embodiments, and as illustrated in FIG. 6, the external processor 675 can include an embedded external controller 676. The external controller 676 can be implemented with software and/or firmware, in one or more embodiments.

Memory device 680 includes an array 600 of memory cells (e.g., array 100 illustrated in FIG. 1). Although the various embodiments are described with reference to NAND memory arrays, embodiments are not limited to a specific architecture of the memory array 600. Some examples of other array architectures suitable for the present embodiments include NOR arrays, AND arrays, and virtual ground arrays.

Memory device 680 includes a decoder 686 (GWL Logic Decoder) coupled to a driver component 688. As illustrated in FIG. 6, the driver component 688 can include global word line (GWL) drivers, well drivers (e.g., P-Well drivers as shown), and source (SRC) drivers coupled to the array 600 and configured to drive appropriate portions of the array 600 and/or memory cells thereof. In various embodiments, the global word line drivers, well drivers, and/or source drivers can be separate components. As an example, the GWL drivers are coupled to the array 600 and configured to provide (e.g., apply) voltages corresponding to selected bias conditions to appropriate local word lines of the array 600.

The decoder 686 can decode address signals 694 received from an internal controller 682 (e.g., control circuitry internal to the memory device 680, such as located on the same memory chip). The memory device 680 also includes a column driver component 689 that can include a number of column drivers and associated column decode circuitry (not shown), which can decode address signals 694. In one or more embodiments, an initiated word line dependent program operation can be performed using only one level of decoding. For instance, the address signals 694 provided to global word line driver decoder 686 are decoded a single time in order to perform a selected word line dependent program inhibit scheme using the appropriate voltages corresponding to the selected bias conditions.

Memory device 680 also includes input/output (I/O) control component 684, which can manage input of commands, addresses, and data to the memory device 680 (e.g., from host processor 675 via an I/O bus 678), as well as output of data and status information from the memory device 680. The I/O control component is in communication with the internal controller 682, which receives control signals from processor 675 over a control link 677. As illustrated in the embodiment shown in FIG. 6, the control signals may include a chip enable (ce#), a command latch enable (de), an address latch enable (ale), and a write enable (we#), among other control signals. Memory device 680 receives commands (in the form of command signals), addresses (in the form of address signals), and data (in the form of data signals) from processor 675 over I/O bus 678 and outputs data to processor 675 over I/O bus 678.

In various embodiments, the internal controller 682 can include a state machine and/or various command circuits and/or control components. In the embodiment illustrated in FIG. 6, the internal controller includes an address register 683 that can latch address signals (e.g., address signals 694) prior to decoding, a control register 685, and a command register 687 that can latch incoming commands. The internal controller 682 controls access to the memory array 600 in response to the incoming commands and generates status information for an external controller (e.g., external processor 675 and/or external controller 676). The internal controller 682 is coupled to the decoder 686, column driver component 689, and to the driver component 688 to control the decode component 686 (e.g., via address signals 694 and inhibit select signals 692), the column driver component 689 (e.g., via address signals 694), and the drivers of driver component 688 (e.g., via inhibit select signals 692, inhibit control signals 695, and voltage select signals 697).

In various embodiments, the internal controller 682 includes a control component (e.g., control register 685) coupled to the driver component 688. The control register 685 includes one or more inhibit registers 681 that receive bias condition information corresponding to a selected particular biasing scheme (e.g., a particular biasing scheme selected by a controller, such as host processor 675, external to memory device 680), in association with performing a particular access operation. In one or more embodiments, and as described further below, the bias condition information corresponding to the selected particular biasing scheme is provided to the inhibit registers 681 prior to providing a data load command associated with the particular access operation to the internal controller (e.g., to internal controller 682 via I/O control component 684 and I/O bus 678).

The memory device 680 includes a voltage supply component 604 coupled to the internal controller 682 and configured to provide voltages via voltage signals 697 (v_select) to the driver component 688. The v_select signals 697 correspond to selected bias condition information provided to the voltage supply component 604 from the control registers 685 via control signals 696, which can be used to regulate the supply 604. As such, the voltage signals 697 can provide several different voltages to the global word line drivers, for instance. The different voltages can then be provided to the appropriate word lines based on the particular inhibit select signals 692, address signals 694, and inhibit control signals 695 (e.g., based on the particular program inhibit scheme and corresponding bias conditions selected by the external controller, in response to the position of the target word line, for instance).

In the embodiment illustrated in FIG. 6, the internal controller 682 is also coupled (e.g., via I/O component 684) to a cache register 693. Cache register 693 latches data, either incoming or outgoing, as directed by internal controller 682 to temporarily store data while the memory array 600 is busy writing or reading, respectively, other data. During a write operation, data is passed from the cache register 693 to data register 691 for transfer to the memory array 600, and then new data can be latched in the cache register 693 from the I/O control component 684. During a read operation, data is passed from the cache register 693 to the I/O control component 684 for output to the external processor 675, and then new data is passed from the data register 691 to the cache register 693. A status register (not shown) can be coupled to I/O control component 684 and internal controller 682 to latch the status information for output to the processor 675.

It will be appreciated by those skilled in the art that additional circuitry and signals can be provided, and that the memory system 670 of FIG. 6 has been simplified to help focus on the present disclosure. Additionally, while the memory device of FIG. 6 has been described in accordance with popular conventions for receipt and output of the various signals, it is noted that the various embodiments are not limited by the specific signals and I/O configurations described unless expressly noted herein.

In various embodiments, and as illustrated at step 520 of FIG. 5, an access operation sequence that includes selection of an access line dependent biasing scheme can include initiating an access line dependent operation by providing a biasing scheme command to a controller of the memory device (e.g., an internal controller such as internal controller 682). Although the embodiment of FIG. 5 is discussed in the context of an access line dependent program operation, embodiments are not limited to a particular type of access operation.

In various embodiments, the biasing scheme command is provided to the internal controller from an external controller (e.g., a host processor 675 or an embedded external controller, such as 676). The external controller selects a particular word line dependent biasing scheme (e.g., a particular program inhibit scheme of a number of program inhibit schemes) to be used in performing the access operation (e.g., the program operation). In one or more embodiments, the number of different biasing schemes (e.g., schemes 316-1, 316-2, and 316-3 shown in FIG. 3) and respective corresponding bias conditions can be stored in the memory array (e.g., array 600) and can be provided to the external controller upon request (e.g., in response to the biasing scheme command). In one or more embodiments, the different biasing schemes and respective corresponding bias conditions are stored within a read only memory portion of the array, such as a one time programmable (OTP) portion 699 of array 600. As noted above, the selected biasing scheme can be one of a number of program inhibit schemes, programming potential ramp schemes, and read bias schemes, among others.

In various embodiments, the external controller selects the particular program inhibit scheme to be used in association with the program operation based on a program address (e.g., based on a target word line address). The program address can indicate an address space corresponding to the target word line (e.g., the position of the target word line in a NAND string). In one or more embodiments, the external controller selects the particular biasing scheme and corresponding bias conditions prior to providing the program address associated with the program operation to the internal controller 682 of the memory device 680. That is, the external controller selects the particular biasing scheme and corresponding bias conditions prior to step 542.

At step 522, the external controller provides bias condition information corresponding to the selected particular biasing scheme to a control register of the memory device (e.g., control register 685 of device 680). In one or more embodiments, the external controller provides the bias condition information corresponding to the selected particular biasing scheme to the controller 682 via a set features command. As illustrated at step 522, control registers for the selected biasing scheme (e.g., inhibit registers 681) are loaded with the selected bias information according to the program address. The bias condition information corresponding to the selected program inhibit scheme indicates particular voltages to be provided to the appropriate portions of the array 600 (e.g., via global word line drivers, well drivers, source drivers, and/or column drivers). The particular voltages can be supplied by voltage supply component 604 and provided to the driver components via voltage select signals 697.

Inhibit control signals 595 (e.g., control signals 695 shown in FIG. 6) are provided to the appropriate drivers of driver component 588 (e.g., driver component 688 shown in FIG. 6). The inhibit control signals 595 indicate the particular voltages to be provided to the array 600 via the drivers of driver component 688.

At step 540 of the sequence illustrated in FIG. 5, a data load command is provided to, and processed by, the internal controller 682. The input data is recognized and latched by the internal control component via a command latch signal.

In step 542, program address data is input to decode component 686 and driver component 689 via address signals 694 from the internal controller 682. For instance, the external controller provides the program address to an address register (e.g., address register 683) of the memory device. At step 544, program data is input to data I/O control component 684. The program data can be latched in a register (e.g., data register 691) for the selected bit lines. At step 546, a program command is provided by the internal controller 682. Step 548 indicates a standby time (e.g., a few micro seconds) before the program algorithm starts at step 550 (e.g., before program voltage pulses and the selected bias conditions are provided to the array in order to program memory cells of array 600 using the particular selected program inhibit scheme.

In contrast to prior art approaches such as that discussed above in FIG. 4, in which a particular biasing scheme and corresponding bias conditions are determined via built in trim registers and large internal combination logic within a memory device (e.g., NAND device 680), one or more embodiments of the present disclosure provide increased flexibility and functionality by shifting the selection function of word line dependent biasing schemes and corresponding bias conditions to a controller external to the memory device.

For instance, in the embodiment illustrated in FIG. 5, the particular program inhibit scheme and corresponding bias conditions are selected by the external controller (e.g., processor 675) prior to providing the data load command at step 540. As such, the complex combination logic 456 and driver circuitry 454 used in previous approaches to set up the selected biasing schemes (e.g., to determine the appropriate bias conditions for particular word line dependent biasing schemes), is not necessary. For instance, in step 551 of FIG. 5, the particular selected program inhibit scheme can be enabled via signals 692 and the corresponding bias conditions are provided to the appropriate drivers of driver component 688 based on address signals 694, inhibit control signals 695, and voltage select signals 697. In this manner, the drivers (e.g., the GWL drivers, well drivers, source drivers and column drivers) of driver components 688 and 691 drive the appropriate portions of the array with the particular bias conditions (e.g., voltages) corresponding to the selected program inhibit scheme when the memory device 680 is ready, as shown at step 560.

One or more embodiments of the present disclosure also provide the capability of adjusting biasing schemes and/or adding additional biasing schemes without physically modifying the hardware components (e.g., driver circuitry, decode circuitry, trim registers, etc.) of the NAND memory device 680. For instance, the external controller can adjust at least one of the bias conditions corresponding one or more of the different selectable biasing schemes (e.g., from an initial value to an adjusted value). In one or more embodiments, the external controller can be configured to add one or more additional biasing schemes to the number of different selectable schemes (e.g., via software and/or firmware on the external controller).

Conclusion

The present disclosure includes methods, devices, and systems for word line biasing. One embodiment includes selecting, using a controller external to the memory device, a particular access line dependent biasing scheme and corresponding bias conditions for use in performing an access operation on an array of memory cells of the memory device, and performing the access operation using the selected particular access line dependent biasing scheme and corresponding bias conditions. In one or more embodiments, the selected particular access line dependent biasing scheme and corresponding bias conditions is selected by the controller external to the memory device based, at least partially, on a target access line of the array.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A controller, comprising:
   a control register configured to provide an inhibit control signal directly to a number of global access line drivers coupled to an array of memory cells to perform an access operation on the array using a selected particular access line dependent biasing scheme;
   wherein the selected particular access line dependent biasing scheme is selected by an external controller based, at least partially, on a position of a target access line of the array.

2. The controller of claim 1, further comprising an address register and a command register.

3. The controller of claim 1, wherein the controller is configured to control receiving the bias condition information corresponding to the particular biasing scheme from the external controller prior to receiving a data load command associated with performing a program operation on the array.

4. The controller of claim 1, wherein the controller is configured to control providing particular voltages to the array, via the number of global access line drivers, a well region driver, and/or a common source driver, wherein the particular voltages are based, at least partially, on bias condition information corresponding to the particular access line dependent biasing scheme.

5. The controller of claim 1, wherein the control register includes an inhibit register.

6. The controller of claim 1, wherein the controller is configured to control accessing the array using only one level of decoding.

7. An apparatus, comprising:
   an array of memory cells;
   a number of global access line drivers coupled to the array;
   an internal controller comprising a control register configured to provide an inhibit control signal directly to the number of global access line drivers to perform an access operation on the array using a selected particular access line dependent biasing scheme; and
   an external controller configured to select the selected particular access line dependent biasing scheme based, at least partially, on a position of a target access line of the array.

8. The apparatus of claim 7, wherein the internal controller is configured to regulate a voltage supply component based on bias conditions corresponding to the selected particular access line dependent biasing scheme.

9. The apparatus of claim 7, wherein the number of global access line drivers are configured to provide voltages corresponding to the selected bias conditions to appropriate local access lines of the array.

10. The apparatus of claim 7, wherein the internal controller is configured to perform the access operation on the array using a single level of address decoding.

11. The apparatus of claim 7, wherein the bias conditions corresponding to the selected particular access line dependent biasing scheme are received by the internal controller via a set features command from the external controller.

12. The apparatus of claim 7, wherein the selected particular access line dependent biasing scheme is one of a number of different biasing schemes including at least two different program biasing schemes and a read biasing scheme.

13. The apparatus of claim 7, further comprising a global access line decoder coupled to the internal controller and configured to decode at least a portion of an address corresponding to the target access line and an inhibit select signal corresponding to the selected particular access line dependent biasing scheme.

14. The apparatus of claim 7, wherein the apparatus is a memory system.

15. The apparatus of claim 7, wherein the external controller is a host.

16. A method, comprising:
    selecting, via an external controller, a particular access line dependent biasing scheme and corresponding bias conditions for use in performing an access operation on a memory array coupled to an internal controller; and
    providing bias condition information corresponding to the selected particular access line dependent biasing scheme to a control component of the internal controller prior to providing a data load command associated with the access operation to the internal controller.

17. The method of claim 16, including selecting the particular access line dependent biasing scheme based, at least partially, on a target access line of the memory array.

18. The method of claim 16, further comprising selecting, via the external controller, the particular access line dependent biasing scheme from a number of different biasing schemes.

19. The method of claim 18, further comprising storing the number of different biasing schemes and corresponding bias condition information in the memory array.

20. The method of claim 16, wherein the control component comprises an inhibit register configured to receive the bias condition information corresponding to the selected particular access line dependent biasing scheme, and wherein the method includes providing, via the inhibit register, a corresponding inhibit control signal to a number of global access line drivers coupled to the control component.

* * * * *